(12) United States Patent
Den Breejen et al.

(10) Patent No.: US 11,508,892 B2
(45) Date of Patent: Nov. 22, 2022

(54) FOLDED HEATSINK DESIGN FOR THERMAL CHALLENGING LED APPLICATIONS

(71) Applicant: LUMILEDS LLC, San Jose, CA (US)

(72) Inventors: Jeroen Den Breejen, Farmington Hills, MI (US); Zongjie Yuan, Santa Clara, CA (US); Ronan Letoquin, San Jose, CA (US)

(73) Assignee: Lumileds LLC, San Jose, CA (US)

( * ) Notice: Subject to any disclaimer, the term of this patent is extended or adjusted under 35 U.S.C. 154(b) by 0 days.

(21) Appl. No.: 16/859,775

(22) Filed: Apr. 27, 2020

(65) Prior Publication Data

US 2020/0343427 A1    Oct. 29, 2020

Related U.S. Application Data

(60) Provisional application No. 62/839,514, filed on Apr. 26, 2019.

(51) Int. Cl.
*H01L 33/64* (2010.01)
*H01L 25/075* (2006.01)

(52) U.S. Cl.
CPC ........ *H01L 33/642* (2013.01); *H01L 25/0753* (2013.01); *H01L 2933/0075* (2013.01)

(58) Field of Classification Search
CPC combination set(s) only.
See application file for complete search history.

(56) References Cited

U.S. PATENT DOCUMENTS

| | | | |
|---|---|---|---|
| 7,547,124 B2* | 6/2009 | Chang | F21V 29/717 362/373 |
| 2008/0175008 A1* | 7/2008 | Hu | F21V 29/763 362/373 |
| 2009/0115833 A1* | 5/2009 | Soulliaert | B41J 2/45 347/238 |
| 2016/0040853 A1* | 2/2016 | Heine | F21V 29/76 362/547 |
| 2018/0356083 A1* | 12/2018 | Duong | F21V 29/70 |

* cited by examiner

*Primary Examiner* — Ratisha Mehta

(57) ABSTRACT

This specification discloses heatsinks comprising a continuous sheet of thermally conductive material folded into a structure comprising a plurality of fins defined by bends in the sheet and arranged to transfer heat to surrounding air. The sheet may be further folded to form a planar surface defined by one or more bends in the sheet and on which one or more LEDs may be mounted. Optionally, the sheet may be further folded to partially enclose the fins within a tunnel formed by side walls defined by bends in the sheet.

15 Claims, 9 Drawing Sheets

1200

| Attach LED assembly to flat sheet of thermally conductive material. | — 1205 |

| Bend sheet of thermally conductive material into folded heat sink configuration. | — 1210 |

Fig. 12

FOLDED HEATSINK DESIGN FOR THERMAL CHALLENGING LED APPLICATIONS

CROSS REFERENCE TO RELATED APPLICATIONS

This application claims benefit of priority to U.S. Provisional Patent Application No. 62/839,514 filed Apr. 26, 2019 which is incorporated herein by reference in its entirety.

FIELD OF THE INVENTION

The invention relates generally to LEDs and to heatsinks for LED applications, for example for automotive lighting and illumination applications.

BACKGROUND

Semiconductor light emitting diodes and laser diodes (collectively referred to herein as "LEDs") are among the most efficient light sources currently available. The emission spectrum of an LED typically exhibits a single narrow peak at a wavelength determined by the structure of the device and by the composition of the semiconductor materials from which it is constructed. By suitable choice of device structure and material system, LEDs may be designed to operate at ultraviolet, visible, or infrared wavelengths.

LEDs may be combined with one or more wavelength converting materials (generally referred to herein as "phosphors") that absorb light emitted by the LED and in response emit light of a longer wavelength. Such devices may be referred to as phosphor-converted LEDs ("pcLEDs").

In many common LED applications, e.g. automotive lighting and illumination, the LED is mounted on a heatsink for cooling purposes. Typically, such heatsinks are made from machined, molded and/or extruded aluminum or similar materials, and the LED is placed onto a printed circuit board with a dielectric isolator layer and, with the optional use of thermal interface material (TIM), attached to the heatsink.

SUMMARY

This specification discloses heatsinks comprising a continuous sheet of thermally conductive material folded into a structure comprising a plurality of fins defined by bends in the sheet and arranged side by side to transfer heat to surrounding air. The sheet may be further folded to form a planar surface defined by one or more bends in the sheet and on which one or more LEDs may be attached. Optionally, the sheet may be further folded to partially enclose the fins within a tunnel formed by side walls defined by bends in the sheet.

The fins may be formed, for example, by a sequence of bends in the sheet that alternate in folding direction to form fins arranged with their surfaces parallel or substantially parallel to each other. Two fins are substantially parallel if the angle between them is less than 45 degrees. In such cases the fins may be oriented, for example, perpendicular, substantially perpendicular, parallel or substantially parallel to a surface of the heatsink on which one or more LEDs may be attached. For example, a sequence of serpentine bends in alternating directions may arrange the fins with their surfaces parallel to each other. Alternatively, a sequence of acute angle bends in alternating directions may arrange the fins with their surfaces angled with respect to each other but still substantially parallel.

Any other suitable arrangements of the fins may also be used.

Variations in which the thermally conductive sheet is folded to enclose the fins in a tunnel may be cooled by forced air blown through the tunnel. In some other variations, the fins are not enclosed by a tunnel and may be cooled primarily by convection.

In some variations the LEDs are attached to a surface of the thermally conductive sheet with few or no intervening layers or structures. Other variations may comprise one or more additional layers or components disposed between the LEDs and the heat sink.

The LEDs and some or all of other components (for example, one or more LED controllers) to be attached to the heatsink may be attached to the thermally conductive sheet while it is still in a flat configuration. Any desired openings (for example, through holes for fasteners) or reference marks may also be formed in the sheet while it is flat, before folding. After the LEDs and other components are attached, the thermally conductive sheet may be folded into the desired heat sink configuration. Any suitable conventional sheet folding process may be used.

This manufacturing approach facilitates attachment of the LEDs and other components to the heat sink because the flat form factor of the thermally conductive sheet is compatible with conventional pick- and place assembly methods and systems. In contrast, attachment of LEDs and other components to non-planar structures, such as to extruded or molded heatsinks for example, may be more difficult and more expensive.

The arrangements of LEDs and folded heatsinks disclosed in this specification may optimize thermal performance at lower system cost using different heatsink manufacturing steps and materials, reduce the amount of thermal resistance by choosing the most optimal LED concept, take out many thermal interfaces in the system, and optimize the heatsink for performance, cost and manufacturability as well as easily integrate mounting features.

These and other embodiments, features and advantages of the present invention will become more apparent to those skilled in the art when taken with reference to the following more detailed description of the invention in conjunction with the accompanying drawings that are first briefly described.

BRIEF DESCRIPTION OF THE DRAWINGS

FIG. 12 shows a flowchart depicting a method for assembling a light emitting device comprising an LED and a heatsink formed from a continuous thermally conductive sheet of material folded to form a plurality of fins arranged to transfer heat to surrounding air and a surface to which the LED may be attached

DETAILED DESCRIPTION

The following detailed description should be read with reference to the drawings, in which identical reference numbers refer to like elements throughout the different figures. The drawings, which are not necessarily to scale, depict selective embodiments and are not intended to limit the scope of the invention. The detailed description illustrates by way of example, not by way of limitation, the principles of the invention.

Figure 1:
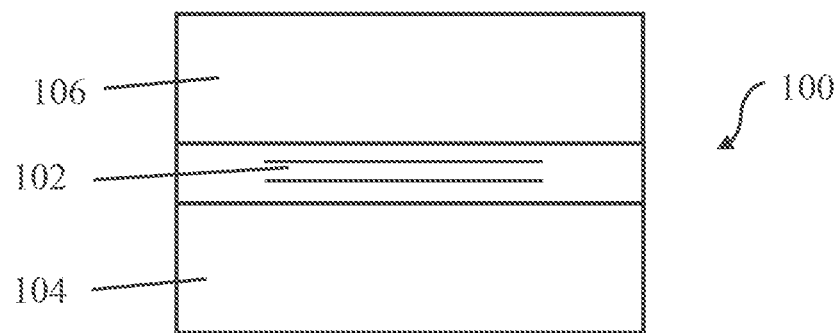
FIG. 1 shows a schematic cross-sectional view of an example pcLED.

FIG. 1 shows an example of an individual pcLED 100 comprising a semiconductor diode structure 102 (an LED) disposed on a substrate 104, and a phosphor layer or structure 106 disposed on the LED. Semiconductor diode structure 102 typically comprises an active region disposed between n-type and p-type layers. Application of a suitable forward bias across the diode structure results in emission of light from the active region. The wavelength of the emitted light is determined by the composition and structure of the active region.

The LED may be, for example, a III-Nitride LED that emits blue, violet, or ultraviolet light. LEDs formed from any other suitable material system and that emit any other suitable wavelength of light may also be used. Other suitable material systems may include, for example, III-Phosphide materials, III-Arsenide materials, and II-VI materials.

Any suitable phosphor materials may be used, depending on the desired optical output from the pcLED.

Figure 2A:
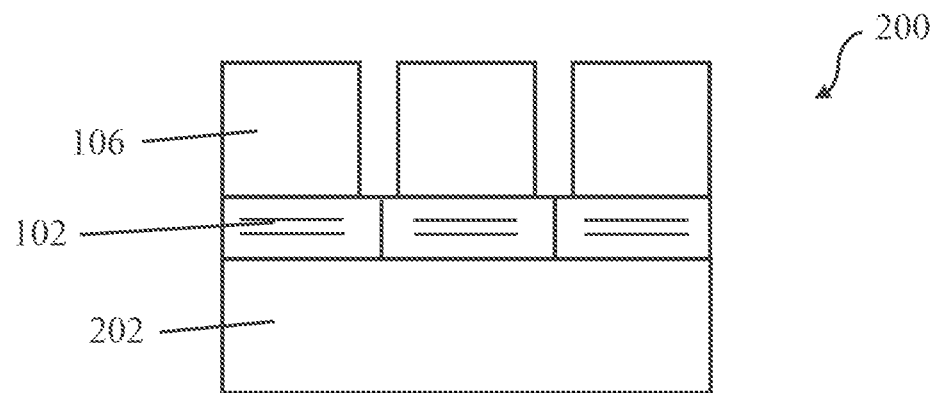
FIGS. 2A and 2B show, respectively, cross-sectional and top schematic views of an array of pcLEDs.
Figure 2B:
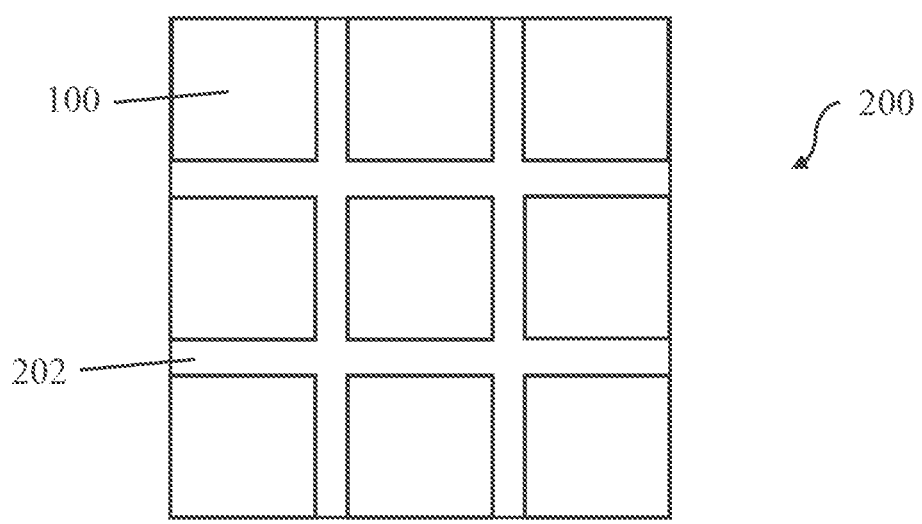

FIGS. 2A-2B show, respectively, cross-sectional and top views of an array 200 of pcLEDs 100 disposed on a substrate 202. Such an array may include any suitable number of pcLEDs arranged in any suitable manner. In the illustrated example the array is depicted as formed monolithically on a shared substrate, but alternatively an array of pcLEDs may be formed from separate individual pcLEDs. Substrate 202 may optionally comprise CMOS circuitry for driving the LED, and may be formed from any suitable material.

Figure 3A:
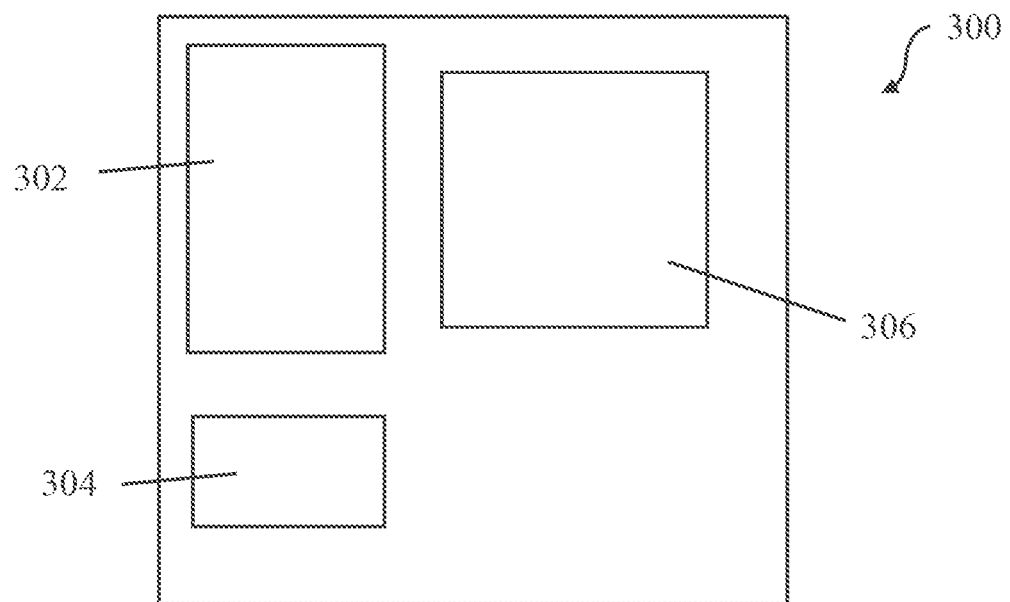
FIG. 3A shows a schematic top view of an electronics board on which an array of pcLEDs may be mounted, and FIG. 3B similarly shows an array of pcLEDs mounted on the electronic board of FIG. 3A.
Figure 3B:
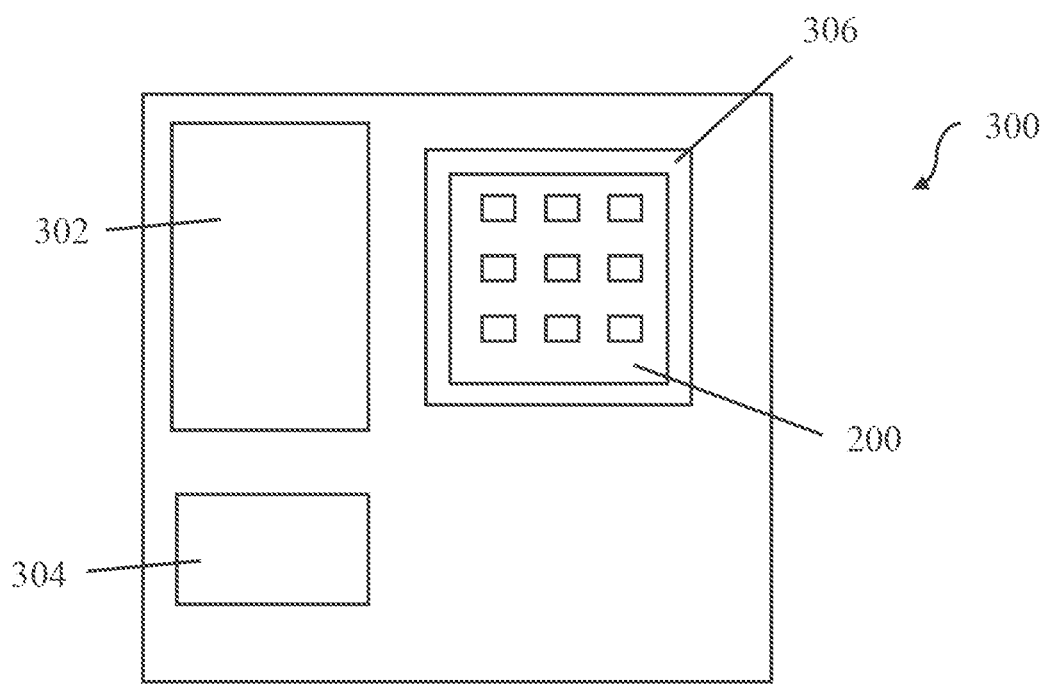

As shown in FIGS. 3A-3B, a pcLED array 200 may be mounted on an electronics board 300 comprising a power and control module 302, a sensor module 304, and an LED attach region 306. Power and control module 302 may receive power and control signals from external sources and signals from sensor module 304, based on which power and control module 302 controls operation of the LEDs. Sensor module 304 may receive signals from any suitable sensors, for example from temperature or light sensors. Alternatively, pcLED array 200 may be mounted on a separate board (not shown) from the power and control module and the sensor module.

Figure 4A:
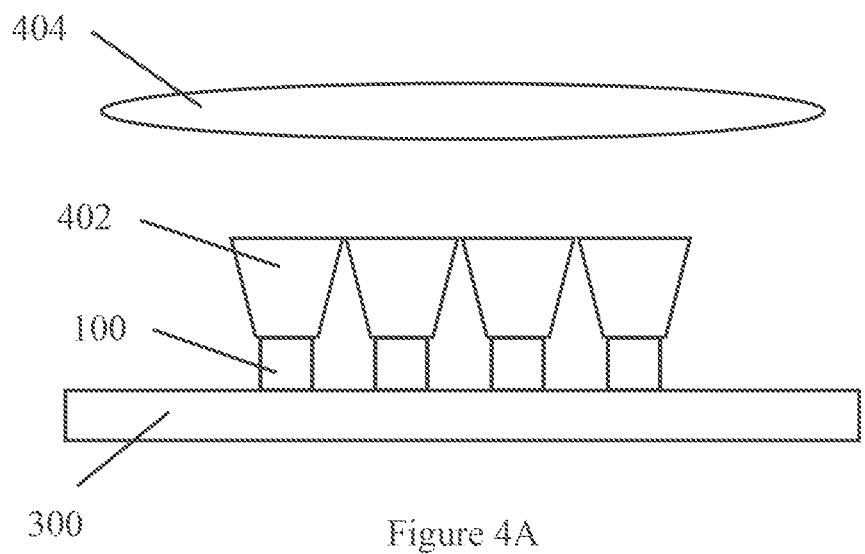
FIG. 4A shows a schematic cross sectional view of an array of pcLEDs arranged with respect to waveguides and a projection lens.
Figure 4B:
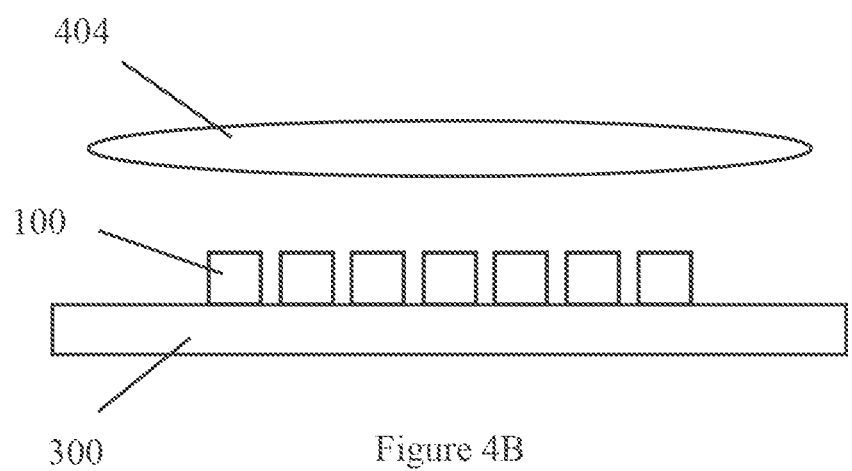
FIG. 4B shows an arrangement similar to that of FIG. 4A, without the waveguides.

Individual pcLEDs may optionally incorporate or be arranged in combination with a lens or other optical element located adjacent to or disposed on the phosphor layer. Such an optical element, not shown in the figures, may be referred to as a "primary optical element". In addition, as shown in FIGS. 4A-4B a pcLED array 200 (for example, mounted on an electronics board 300) may be arranged in combination with secondary optical elements such as waveguides, lenses, or both for use in an intended application. In FIG. 4A, light emitted by pcLEDs 100 is collected by waveguides 402 and directed to projection lens 404. Projection lens 404 may be a Fresnel lens, for example. This arrangement may be suitable for use, for example, in automobile headlights. In FIG. 4B, light emitted by pcLEDs 100 is collected directly by projection lens 404 without use of intervening waveguides. This arrangement may particularly be suitable when pcLEDs can be spaced sufficiently close to each other, and may also be used in automobile headlights as well as in camera flash applications. A microLED display application may use similar optical arrangements to those depicted in FIGS. 4A-4B, for example. Generally, any suitable arrangement of optical elements may be used, depending on the desired application.

As explained above, for many applications LEDs or arrays of LEDs are placed on a heatsink for cooling purposes. Whether an LED is attached directly to the heatsink or instead attached via one or more intervening layers of material depends in part on whether or not the LED includes an electrically isolated thermal pad that may be attached to an electrically conductive surface without an intervening insulator layer.

Figure 5A:
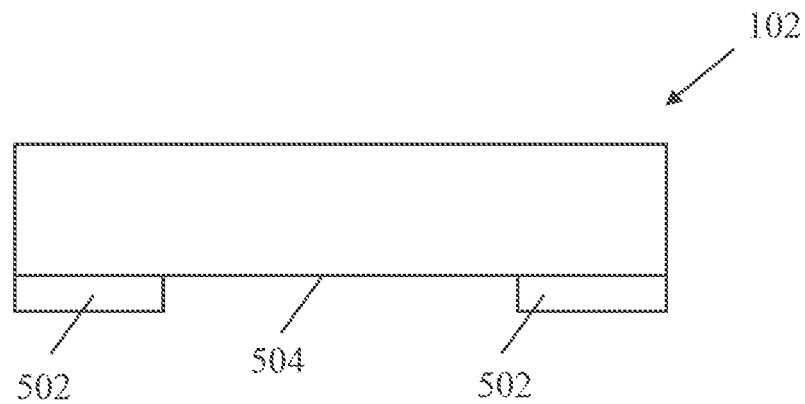
FIG. 5A shows a schematic cross-sectional view of an example LED lacking a thermal pad on its bottom surface.

Referring to FIG. 5A, an example conventional bottom contact LED 102 comprises two metal contacts 502 on a bottom surface 504 of the LED, by which electrical contact may be made to opposite sides of the n-p junction in the LED. Typically, LEDs of this structure are mounted on printed circuit board (PCB) with the electrical contacts 502 connected to conductive traces on the PCB and other portions of bottom layer 504 electrically insulated by a dielectric layer on the surface of the PCB from electrical contact with electrical conductors. LEDs of this configuration are typically spaced apart from any heat sink by at least the PCB, which increases thermal resistance between the LED and the heatsink.

Figure 5B:
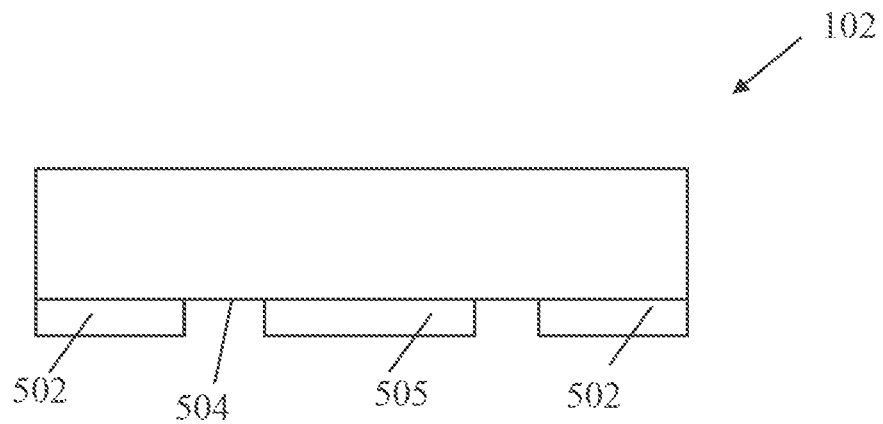
FIG. 5B shows a schematic cross-sectional view of an example LED comprising electrical contacts and a partial thermal pad on its bottom surface.

FIG. 5B shows an example bottom contact LED 102 comprising metal contacts 502 and, in addition, a metal thermal pad 505 disposed on a portion of the bottom surface 504 not occupied by contacts 502. Thermal pad 505 is electrically isolated from the semiconductor junction in LED 102, and consequently can be placed in direct contact with an electrically conductive surface, for example an electrically conductive surface of a metal heatsink. This facilitates flow of heat from LED 102 through partial thermal pad 505 into the heatsink.

Figure 5C:
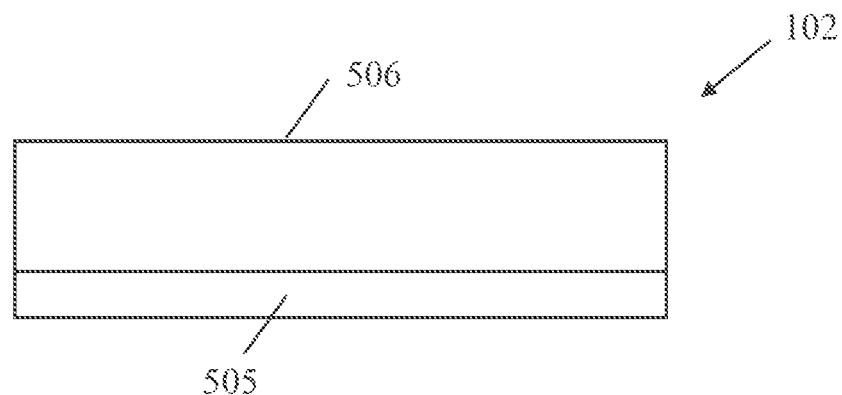
FIG. 5C shows a schematic cross-sectional view of an example LED comprising a full thermal pad on its bottom surface.

FIG. 5C shows an example LED in which contacts (not shown) to opposite sides of the n-p junction are made through the top surface 506 of the LED, and a thermal pad 505 is disposed on most or all of bottom surface 504 of the LED. Although shown as a continuous structure, in this variation thermal pad 505 may be segmented into two or more smaller pads. As in FIG. 5B, thermal pad 505 is electrically isolated from the n-p junction and may therefore be placed in direct contact with an electrically conductive surface of a metal heatsink. This arrangement further facilitates cooling of LED 102.

Referring now to FIGS. 6A, 6B, 7A, and 7B, this specification discloses heatsinks 600 comprising a continuous sheet 602 of thermally conductive material folded into a structure comprising a plurality of fins 604 defined by bends in the sheet and arranged side by side to transfer heat to surrounding air, and a planar surface 606 defined by one or more bends in the sheet and on which one or more LEDs may be mounted. Optionally, other components may also be mounted on surface 606.

Figure 6A:
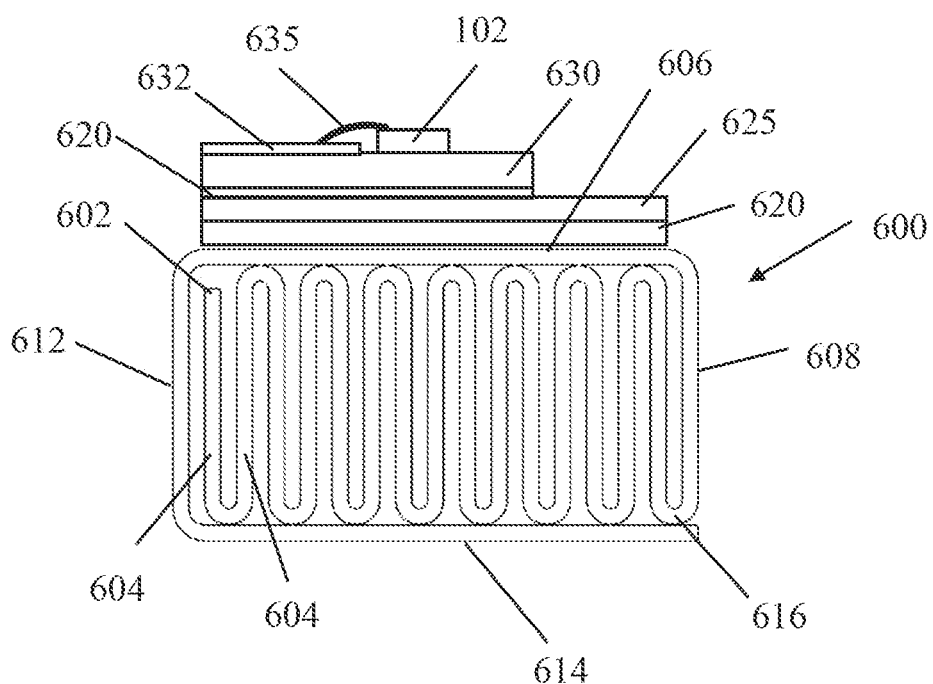
FIG. 6A shows a schematic cross-sectional view of an example of an LED disposed on a heat sink formed from a continuous thermally conductive sheet of material folded to form a plurality of fins arranged to transfer heat to surrounding air and a surface to which the LED may be attached.
Figure 6B:
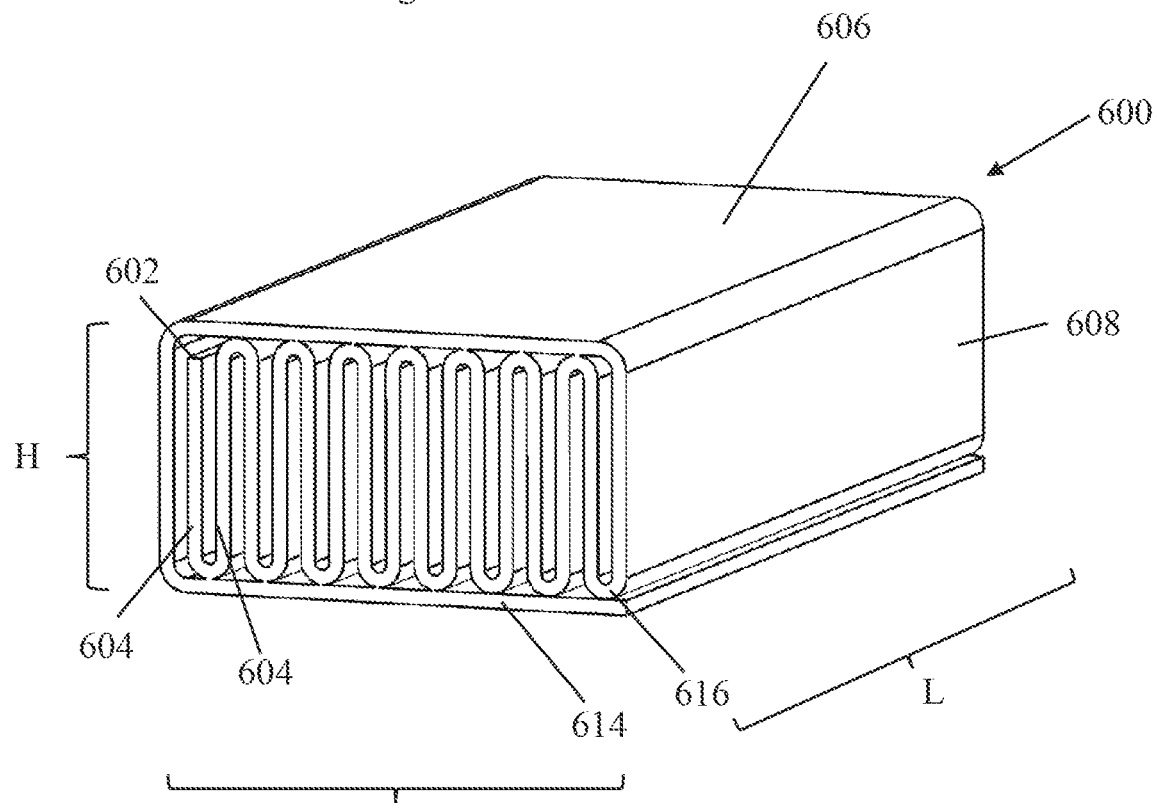
FIG. 6B shows a schematic perspective view of the example heat sink of FIG. 6A.

As shown in the example of FIGS. 6A and 6B, the sheet may be further folded to partially enclose fins 604 within a tunnel formed by side walls defined by bends in the sheet. In this example the tunnel is formed by a first side wall 608, a second side wall (comprising mounting surface 606), a third side wall 612 positioned opposite from the first side wall, and a fourth side wall 614 positioned opposite from second side wall, but any other suitable arrangement of sidewalls forming a tunnel may be used. The example heat sink of FIGS. 6A and 6B may be cooled, for example, by air forced through the tunnel.

Figure 7A:
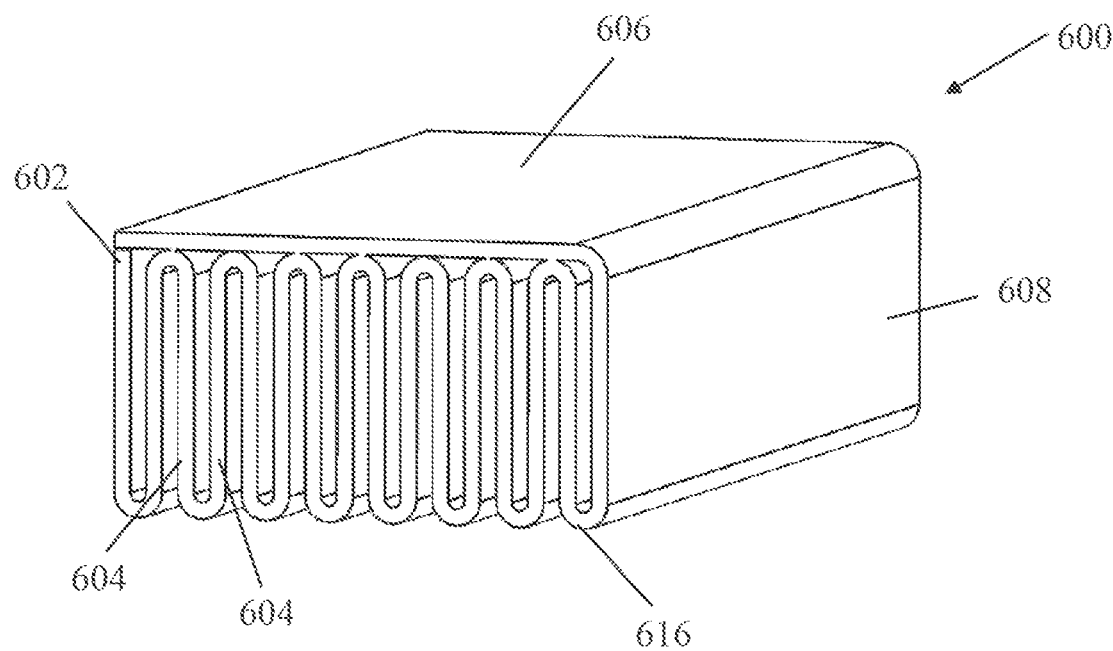
FIG. 7A shows a schematic cross-sectional view of an example variation of the heat sink of FIGS. 6A-6B.
Figure 7B:
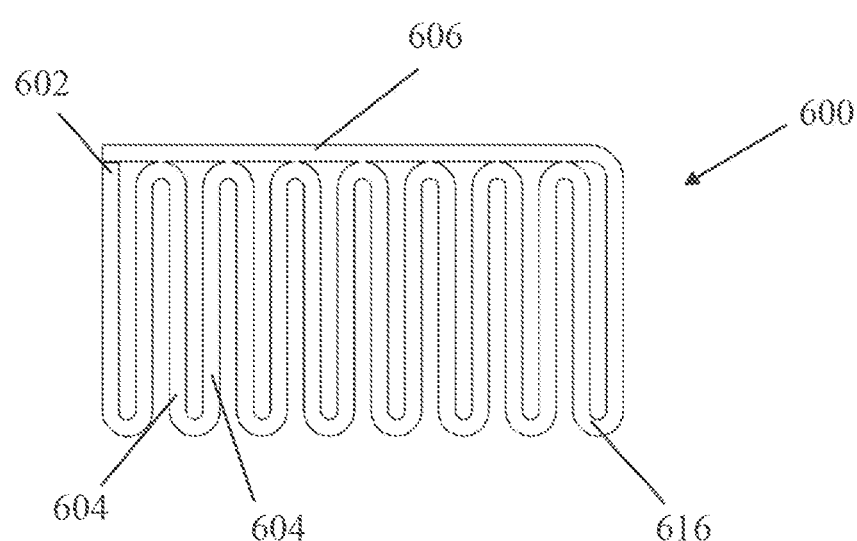
FIG. 7B shows a schematic perspective view of the heatsink of FIG. 7A.

As shown in the example of FIGS. 7A and 7B, the heat sink may be formed with the fins not enclosed by a tunnel structure, in which case convective cooling may be suitable.

In the examples of FIGS. 6A, 6B, 7A, and 7B, the fins are formed by a sequence of serpentine bends 616 made in alternating directions to arrange fins 604 spaced apart and parallel to each other, and perpendicular to surface 606. Alternatively, bends 616 could be made at acute angles to form fins 604 angled with respect to each other but still substantially parallel. Further, the bends in the sheet may be sequenced and configured so that fins 604 are parallel or substantially parallel to surface 606 to which the one or more LEDs are attached. Any other suitable arrangements of the fins may also be used.

Thermally conductive sheet 602 may be, for example, a sheet of copper, aluminum, steel, or any other suitable material or combination of materials.

Referring to FIG. 6B, folded heatsink 600 may have, for example, a height H of about 30 millimeters (mm), a width W of about 50 millimeters, and a length L of about 100 mm. Any other suitable dimensions may also be used.

In addition to an LED and optional components attached to surface 606 of heat sink 600, one or more additional optional components may be attached to any other external surface of heat sink 600, for example to an external surface of side walls 608, 612, and 614 shown in FIGS. 6A and 6B.

Referring again to FIG. 6A, in the illustrated example an LED 102 is attached to heat sink 600 through several intervening layers. A first thermal interface layer 620 is disposed on surface 606 of heatsink 600. First thermal interface layer 620 may comprise, for example, clay, grease, and/or silicone. A base plate 625 is disposed on first thermal interface layer 620. Base plate 625 may be formed from copper, aluminum, or steel for example, and may for example be used to make a mechanical and structural connection to other portions of an apparatus (for example, an automobile headlight assembly) of which the LEDs and the heatsink are a component. A second thermal interface layer 620 is disposed on base plate 625. An electrically and thermally conductive substrate 630 is disposed on the second thermal interface layer. Substrate 630 may be formed, for example, from copper, aluminum, or steel. An LED 102 comprising a full thermal pad (as in FIG. 5C, for example) is disposed on substrate 630, attached to substrate 630 by adhesive or solder for example. A flex circuit 632 is disposed on substrate 630 adjacent to LED 102, and provides electrical power to LED 102 through bond wires 635 attached to top side contacts (not shown) on LED 102.

Figure 8:
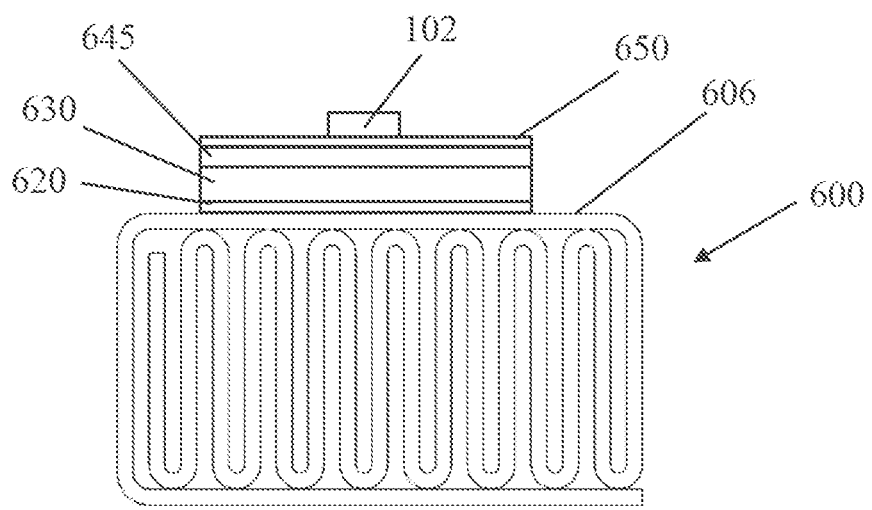
FIG. 8 shows a schematic cross-sectional view of another example of an LED disposed on the example heat sink of FIGS. 6A-6B.

In the example of FIG. 8 a thermal interface layer 620 as described above is disposed on surface 606 of heatsink 600. An electrically and thermally conductive substrate 630 as described above is disposed on the thermal interface layer. A PCB comprising a dielectric layer 645 and conductive traces 650 is disposed on substrate 630. An LED 102 is disposed on the PCB, with bottom surface electrical contacts (as in FIG. 5A, for example) in contact with and receiving electrical power through traces 650. Dielectric layer 645 insulates LED 102 from substrate 630.

Figure 9:
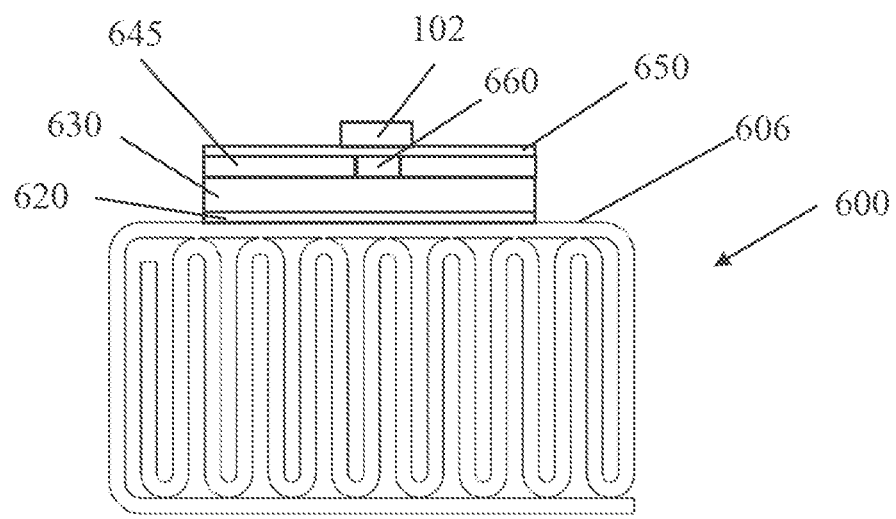
FIG. 9 shows a schematic cross-sectional view of another example of an LED disposed on the example heat sink of FIGS. 6A-6B.

In the example of FIG. 9, a thermal interface layer 620 as described above is disposed on surface 606 of heatsink 600. An electrically and thermally conductive substrate 630 as described above is disposed on the thermal interface layer. A PCB as described above is disposed on substrate 630. An LED 102 is disposed on the PCB, with bottom surface electrical contacts in contact with and receiving electrical power through traces 650. A copper or aluminum pedestal 660 disposed on substrate 630 passes through dielectric layer 645 of the PCB to make contact with a partial thermal pad on the bottom surface of LED 102 (as in FIG. 5B, for example), reducing thermal resistance between LED 102 and heat sink 600.

Figure 10:
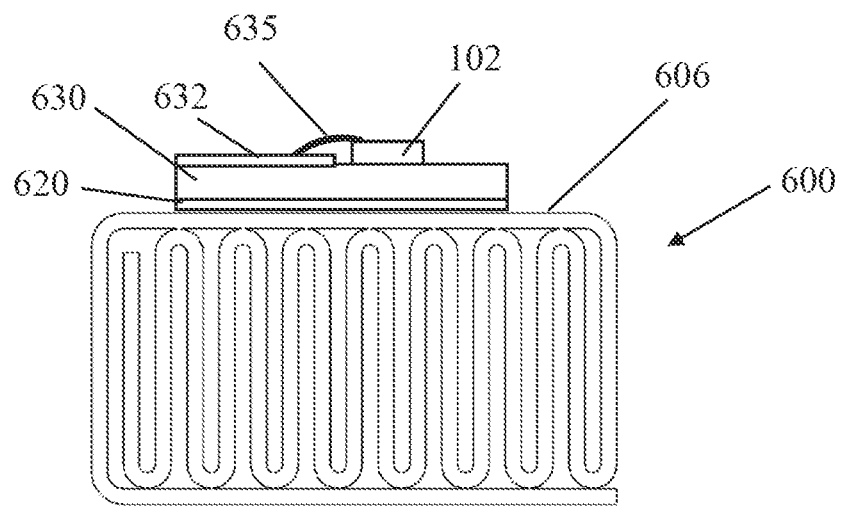
FIG. 10 shows a schematic cross-sectional view of another example of an LED disposed on the example heat sink of FIGS. 6A-6B.

In the example of FIG. 10, a thermal interface layer 620 as described above is disposed on surface 606 of heatsink 600. An electrically and thermally conductive substrate 630 as described above is disposed on the thermal interface layer. An LED 102 comprising a full thermal pad (as in FIG. 5C, for example) is disposed on the substrate. A flex circuit 632 is disposed on thermal interface layer adjacent to LED 102, and provides electrical power to LED 102 through bond wires 635 attached to top side contacts (not shown) on LED 102.

Figure 11:
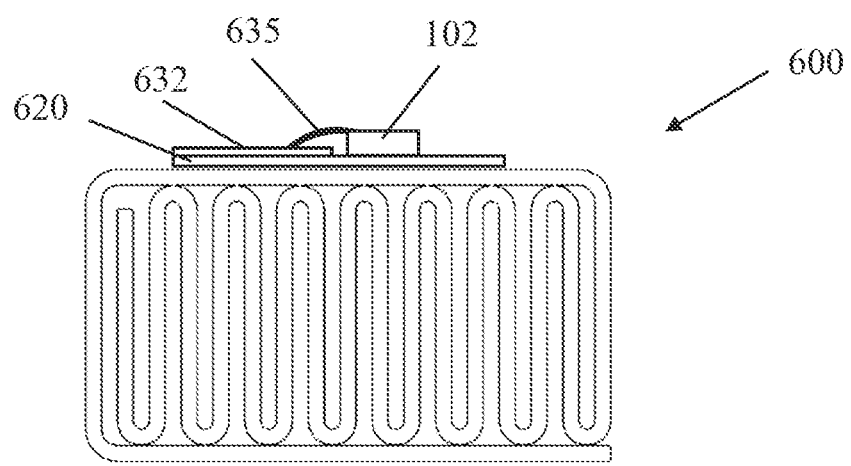
FIG. 11 shows a schematic cross-sectional view of another example of an LED disposed on the example heat sink of FIGS. 6A-6B.

In the example of FIG. 11, a thermal interface layer 620 as described above is disposed on surface 606 of heatsink 600. An LED 102 comprising a full thermal pad (as in FIG. 5C, for example) is disposed directly on the thermal interface layer. A flex circuit 632 is disposed on thermal interface layer adjacent to LED 102, and provides electrical power to LED 102 through bond wires 635 attached to top side contacts (not shown) on LED 102.

The examples of FIGS. 6A, 8, 9, 10, and 11 all employ a heatsink 600 as shown in FIGS. 6A and 6B, but one or more LEDs may be similarly arranged on the variation of heatsink 600 shown in FIGS. 7A and 7B, on any other variations of folded heatsinks described in this specification, or on any other similar heatsinks.

FIG. 12 shows a method 1200 for assembling a light emitting device comprising an LED and a heatsink. In step 1205, an LED assembly is attached to a flat sheet of thermally conductive material. The LED assembly may comprise an LED in combination with, for example, any of the other combinations of components shown and described in the above examples as attaching the LED to the heatsink, or attached along with the LED to the heatsink. The LED assembly may be constructed or partially constructed on the sheet. Alternatively the LED assembly, or portions of the LED assembly, may be assembled prior to attachment to the sheet.

In step 1210 the flat thermally conductive sheet to which the LED assembly is attached is folded into a desired heat sink configuration.

Heatsinks similar to those described above may be formed, for example, from two or more sheets of thermally conductive material. For example, a first sheet may be folded to form fins as described above, and an LED attachment surface 606 may be formed from a second sheet, optionally folded to form other side walls as well. The fins may then be attached to the attachment surface 606 and/or other side walls with glue, solder, and/or mechanical fasteners, for example.

In the examples described above phosphor converted LEDs may be substituted for LEDs 102.

This disclosure is illustrative and not limiting. Further modifications will be apparent to one skilled in the art in light of this disclosure and are intended to fall within the scope of the appended claims.

What is claimed is:

1. A light emitting device comprising:
one or more LEDs; and
a heatsink comprising a continuous sheet of thermally conductive material folded into a structure comprising:
  a first planar portion having a length and a width;
  a first sidewall directly attached to the first planar portion, the first sidewall substantially perpendicular to the first planar portion;
  a second planar portion directly attached to the first sidewall, the second planar portion substantially perpendicular to the first sidewall, the second planar portion substantially parallel to the first planar portion, the second planar portion having a length and a width substantially equal to the length and the width, respectively, of the first planar portion;
  a second sidewall directly attached to the second planar portion; the first and second planar portions and the first and second sidewalls forming a tunnel through which air may be forced;
  a plurality of fins defined by bends in the sheet and arranged side-by-side, the plurality of fins disposed within the tunnel; and
and the one or more LEDs are disposed on the first planar portion outside the tunnel.

2. The light emitting device of claim 1, wherein the fins are oriented parallel or substantially parallel to each other and perpendicular or substantially perpendicular to the first planar portion of the sheet on which the one or more LEDs are attached.

3. The light emitting device of claim 1, wherein the fins are oriented parallel or substantially parallel to each other and parallel or substantially parallel to the first planar portion of the sheet on which the one or more LEDs are attached.

4. The light emitting device of claim 1, wherein the one or more LEDs are disposed directly on a thermal interface layer disposed directly on the first planar portion of the sheet.

5. The light emitting device of claim 1, wherein:
the fins are oriented parallel to each other and perpendicular to the first planar portion of the sheet on which the one or more LEDs are attached; and
the one or more LEDs are disposed directly on a thermal interface layer disposed directly on the first planar portion of the sheet.

6. A light emitting device comprising:
one or more LEDs; and
a heatsink comprising:
  a continuous sheet of thermally conductive material folded into a structure comprising
  a first planar portion having a length and a width;
  a first sidewall directly attached to the first planar portion, the first sidewall substantially perpendicular to the first planar portion;
  a second planar portion directly attached to the first sidewall, the second planar portion substantially perpendicular to the first sidewall, the second planar portion substantially parallel to the first planar portion, the second planar portion having a length and a width substantially equal to the length and the width, respectively, of the first planar portion;
  a second sidewall directly attached to the second planar portion; the first and second planar portions and the first and second sidewalls forming a tunnel through which air may be forced;
  a plurality of fins defined by bends in the sheet and arranged side-by-side, the plurality of fins disposed within the tunnel; and
    one or more LEDs are disposed on the first planar sheet outside the tunnel.

7. The light emitting device of claim 6, wherein the first planar portion is attached to the fins by solder, glue, or mechanical fasteners.

8. The light emitting device of claim 6, wherein the fins are oriented parallel or substantially parallel to each other and perpendicular or substantially perpendicular to the first planar portion on which the one or more LEDs are attached.

9. The light emitting device of claim 6, wherein the fins are oriented parallel or substantially parallel to each other and parallel or substantially parallel to the first planar portion on which the one or more LEDs are attached.

10. The light emitting device of claim 6, wherein the one or more LEDs are disposed directly on a thermal interface layer disposed directly on the first planar portion.

11. The light emitting device of claim 6, wherein:
the fins are oriented parallel to each other and perpendicular to the first planar portion on which the one or more LEDs are attached; and
the one or more LEDs are disposed directly on a thermal interface layer disposed directly on the first planar portion of the sheet.

12. A method for assembling a light emitting device comprising an LED and a heatsink, the method comprising:
folding a thermally conductive sheet into a heatsink structure comprising:
  bending the sheet to form a plurality of fins, the plurality of fins arranged side-by-side;
  after bending the sheet to form the plurality of fins, bending the sheet to form a first sidewall portion;
  after bending the sheet to form the first sidewall portion, bending the sheet to form a first planar portion having a length and a width;
  after bending the sheet to form the first planar portion, bending the sheet to form a second sidewall portion, after bending the sheet to form the second sidewall portion, bending the sheet to form a second planar portion, the second planar portion substantially parallel to the first planar portion, the second planar portion having a length and a width substantially equal to the length and the width, respectively, of the first planar portion, the first and second planar portions and the first and second sidewalls forming a tunnel through which air may be forced;

and attaching one or more LEDs on either the first or the second planar portion outside the tunnel.

13. The method of claim 12, comprising attaching other components to the thermally conductive sheet before folding it into the heatsink structure.

14. The method of claim 12, comprising forming openings in or reference marks on the thermally conductive sheet before folding it into the heatsink structure.

15. The method of claim 12, comprising folding the thermally conductive sheet to form the fins in an orientation parallel or substantially parallel to each other and perpendicular or substantially perpendicular to the first planar portion of the sheet.

\* \* \* \* \*